US006258662B1

United States Patent
Wang et al.

(10) Patent No.: US 6,258,662 B1
(45) Date of Patent: *Jul. 10, 2001

(54) METHOD FOR FORMING CYLINDRICAL DRAM CAPACITORS

(75) Inventors: C. J. Wang, Hsin-Chu; M. S. Liang, Shin-Chu; Y. C. Huang, Hsin-Chu; T. L. Ying, Hsin-Chu; H. C. Huang, Hsin Chu, all of (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 08/851,618

(22) Filed: May 6, 1997

(51) Int. Cl.[7] ................... H01L 21/8242; H01L 21/20
(52) U.S. Cl. .......................................... 438/253; 438/396
(58) Field of Search ................................. 438/255, 387, 438/397, 244, 398, 254, 256, 253, 239, 396; 257/308, 309

(56) References Cited

U.S. PATENT DOCUMENTS

| | | |
|---|---|---|
| 5,084,405 * | 1/1992 | Fazan et al. . |
| 5,162,248 * | 11/1992 | Dennison et al. ............... 437/52 |
| 5,185,282 * | 2/1993 | Lee et al. ........................ 437/47 |
| 5,273,925 | 12/1993 | Yamanaka . |
| 5,274,258 * | 12/1993 | Ahn . |
| 5,279,983 * | 1/1994 | Ahn . |
| 5,346,844 * | 9/1994 | Cho et al. ....................... 437/52 |
| 5,364,811 * | 11/1994 | Ajika et al. .................... 437/52 |
| 5,403,767 | 4/1995 | Kim . |
| 5,668,038 * | 9/1997 | Huang et al. .................. 438/396 |
| 5,691,249 * | 11/1997 | Watanabe et al. ............. 437/233 |
| 5,763,286 * | 6/1998 | Figura et al. . |
| 5,792,689 * | 8/1998 | Yang et al. ..................... 438/253 |
| 6,063,656 * | 5/2000 | Clampitt . |

* cited by examiner

Primary Examiner—Charles Bowers
Assistant Examiner—Evan Pert
(74) Attorney, Agent, or Firm—Tung & Associates

(57) ABSTRACT

The present invention discloses a method for forming a stacked capacitor DRAM cell by first forming polysilicon plugs in a thick oxide layer deposited on a pre-processed semiconductor wafer, a polysilicon layer, a dielectric layer and a polysilicon layer are then sequentially deposited on top of the polysilicon plugs for making electrical contact with the silicon substrate such that a crown-shaped stacked capacitor can be formed on top of a transistor of the DRAM cell and chip real estate can be saved.

18 Claims, 3 Drawing Sheets

METHOD FOR FORMING CYLINDRICAL DRAM CAPACITORS

FIELD OF THE INVENTION

The present invention generally relates to a method for forming cylindrical dynamic random access memory (DRAM) capacitors and more particularly, relates to a method for forming stacked capacitors in DRAM devices by first forming a polysilicon plug for contacting the wafer and then forming crown-shaped upper and lower electrodes on the polysilicon plug. The method is compatible with the chemical mechanical polishing technique and can be used to form stacked capacitors in the less than 0.18 micron technology.

BACKGROUND OF THE INVENTION

DRAM cells have been widely used in modern semiconductor devices. They have been named as dynamic because the cells can retain information only for a limited time and they must be read and refreshed periodically. This is in contrast to a static random access memory cell which does not require periodic refresh signals in order to retain stored data. In a typical DRAM cell, the structure includes a transistor and a storage capacitor. When DRAM cells were first developed, planar type storage capacitors which occupy large wafer surface areas are used. As the circuit density increases in modern semiconductor devices where smaller chips are being made and are being packed with an ever-increasing number of circuits, the specific capacitance of a storage capacitor must be increased in order to meet such demands.

Different approaches have been used in achieving higher capacitance on limited real usage of wafer real estate. For instance, one solution is to store charges vertically in a trench which requires a deep trench formation and encounters significant processing difficulties. The second solution is to build a stacked capacitor on top of the transistor which allows a smaller cell to be built without losing storage capacity. The solution of using a stacked capacitor has become a more accepted and popular approach in the semiconductor fabrication industries.

In modern DRAM cells, small dimension and high capacitance value per unit area are therefore desirable characteristics for achieving high charge storage capacity. A DRAM capacitor is normally formed by at least two layers of electrically conductive material and one layer of a dielectric material. For example, a widely used DRAM capacitor utilizes a thin oxide layer sandwiched between two polysilicon layers to produce a high capacitance capacitor cell. The capacitor can be built by stacking over the bit line on the surface of a silicon substrate. The effective capacitance of a stacked cell is increased over that of a conventional planar cell due to its increased surface area.

A typical 16-Mb DRAM cell 10 having a stacked capacitor 20 built on top is shown in FIG. 1. The DRAM cell 10 can be formed in the following manner. First, standard CMOS fabrication steps are used to form the transistor all the way through the gate oxide growth process. To form the word lines 12, a first polysilicon layer of approximately 2,500 Å thick is deposited and then doped with phosphorous. A thick layer of insulating material 16 such as TEOS (tetraethoxy silicate) oxide of approximately 3,000 Å is then deposited on top of the first polysilicon layer. By using standard photomasking processes, the two layers are etched by a plasma etching technique as a stack. After LDD implants are made in the silicon substrate, oxide spacers are formed on the polysilicon gate structure by depositing a thick layer of TEOS oxide of approximately 2,000 Å and then plasma etching. Gates 12 and 14 are thus formed and covered by a thick insulating layer 16 of oxide. A source and drain mask is then applied for an ion implantation process to form the source and drain regions in the silicon substrate.

In the next fabrication step, photomasking is used to form window openings for the cell contact and plasma etching is used to remove any native oxide layer on the silicon substrate. A second polysilicon layer 22 of approximately 3,500 Å is then deposited and patterned by a photomask to form the lower electrode of the stacked capacitor 20. A dielectric layer 24 of a composite film of oxide-nitride-oxide (ONO) is then deposited as the dielectric layer for the capacitor. The total thickness of the ONO composite film is approximately 70 Å. The ONO composite film can be formed by using a thin layer of native oxide as the first oxide layer, depositing a thin nitride layer on top and then oxidizing the nitride layer to grow a top oxide layer. To complete the fabrication of the stacked capacitor, a third polysilicon layer 28 of approximately 2,000 Å thick is. deposited on top of the dielectric layer and then doped and patterned by a photomask to form an upper electrode. After the formation of the stacked capacitor, peripheral devices can be formed by masking and ion implantation, followed by the formation of a bit line 28 of a polysilicon/metal silicide material. A thick insulating layer 32 of BPSG or SOG is then deposited over the capacitor and reflowed to smooth out the topography and to reduce the step height. Other back-end-processes such as metalization to form metal lines 34 are used to complete the fabrication of the memory device 10.

The stacked capacitor 10 shown in FIG. 1 has been successfully used in 16 Mb DRAM devices. However, as device density increases to 256 Mb or higher, the planar surface required for building the conventional stacked capacitors becomes excessive and can not be tolerated. Furthermore, the topography of the device formed in FIG. 1 requires a difficult planarization process to be performed on the DRAM device. For instance, a reliable method of chemical mechanical polishing (CMP) can not be used.

It is therefore an object of the present invention to provide a method for making stacked capacitor DRAM cells that does not have the drawbacks or shortcomings of the prior art methods.

It is another object of the present invention to provide a method for making stacked capacitor DRAM cells that is compatible with a chemical mechanical polishing method to achieve planarization.

It is a further object of the present invention to provide a method for making stacked capacitor DRAM cells that can be readily adapted in ultra high density devices such as the sub 0.18 micron technology.

It is another further object of the present invention to provide a method for making stacked capacitor DRAM cells by first depositing at least two layers of interpoly-oxide on top of a pre-processed silicon wafer.

It is yet another object of the present invention to provide a method for making stacked capacitor DRAM cells by depositing a silicon nitride layer on a thick oxide layer such that cell contacts can be formed in the oxide layer.

It is still another object of the present invention to provide a method for making stacked capacitor DRAM cells by forming polysilicon plugs in a thick oxide layer by using a nitride layer as etch stop.

It is still another further object of the present invention to provide a method for making stacked capacitor DRAM cells by first forming polysilicon plugs and then crown-shaped lower and upper polysilicon electrodes on top of the plugs.

It is yet another further object of the present invention to provide a method for making stacked capacitor DRAM cells by using a thin ONO composite film as the dielectric layer for the capacitor.

It is still another further object of the present invention to provide a method for forming stacked capacitor DRAM cells by depositing a rugged polysilicon layer on top of the lower polysilicon electrode prior to the deposition of the dielectric layer such that the capacitance of the stacked capacitor can be improved.

SUMMARY OF THE INVENTION

In accordance with the present invention, a stacked capacitor DRAM cell can be formed by first forming a polysilicon plug and then depositing two polysilicon layers and a dielectric layer making electrical connection to the plug forming a crown-shaped capacitor.

In a preferred embodiment, a method for making a stacked capacitor DRAM cell can be carried out by first forming oxide layer on a pre-processed wafer which has transistors, word lines and bit lines formed therein, then forming contact windows and depositing a first polysilicon layer forming polysilicon plugs for making electrical contact with the wafer, then depositing a second polysilicon layer forming crown-shaped lower electrodes, then depositing a dielectric layer on the lower electrodes, and then depositing a third polysilicon layer on the dielectric layer to form crown-shaped upper electrodes.

The present invention is also directed to a method for making a cylindrical capacitor DRAM cell that requires reduced photomasking steps which can be carried out by first providing a pre-processed semiconductor wafer that has transistors, source/drain regions and word lines formed by a first polysilicon layer therein, then depositing and planarizing a first inter-poly-oxide (IPO-1) layer on top of the transistors, then forming first window openings for the first buried contacts in the IPO-1 layer to expose the wafer surface, then depositing a second polysilicon layer and forming bit lines, then depositing and planarizing a second inter-poly-oxide (IPO-2) layer on top of the IPO-1 layer, then depositing a layer of silicon nitride as etch-stop on the IPO-2 layer, then forming second window openings for second buried contacts in the IPO-2 layer to expose the wafer surface, then depositing a third polysilicon layer to fill the second window openings and to form polysilicon plugs by using the nitride layer as etch-stop, then depositing and planarizing a third inter-poly-oxide (IPO-3) layer which has a thickness substantially the same as the height of the capacitor to be built on top of the IPO-2 layer, then forming third window openings for third buried contacts in the IPO-3 layer to expose the polysilicon plugs, then depositing a conformal fourth polysilicon layer on the IPO-3, IPO-2 layers to electrically contact the polysilicon plug, then etching away the IPO-3 layer and the top of the fourth polysilicon layer, then wet etching the remaining IPO-3. The wet etch stops on the silicon nitride layer such that only crown-shaped sections of the fourth polysilcon layer remain as the lower electrodes for the capacitors, then conformally depositing a thin layer of dielectric material on top of the crown-shaped sections and the nitride etch-stop, and then conformally depositing a fifth polysilicon layer on top of the dielectric layer and forming upper electrodes for the cylindrical capacitors.

BRIEF DESCRIPTION OF THE DRAWINGS

These and other objects, features and advantages of the present invention will become apparent from the following detailed description and the appended drawings in which.

DETAILED DESCRIPTION OF THE PREFERRED AND ALTERNATE EMBODIMENTS

The present invention provides a method for making a stacked capacitor dynamic random access memory cell by first forming a polysilicon plug contacting the silicon wafer through inter-poly-oxide layers and then forming lower and upper polysilicon electrodes in contact with the polysilicon plugs. The method utilizes a silicon nitride etch-stop layer deposited on top of the inter-poly-oxide layers such that windows of cell contacts can be formed for the deposition of the polysilicon plugs and crown-shaped electrode can be formed by a wet etch method.

Figure 1:
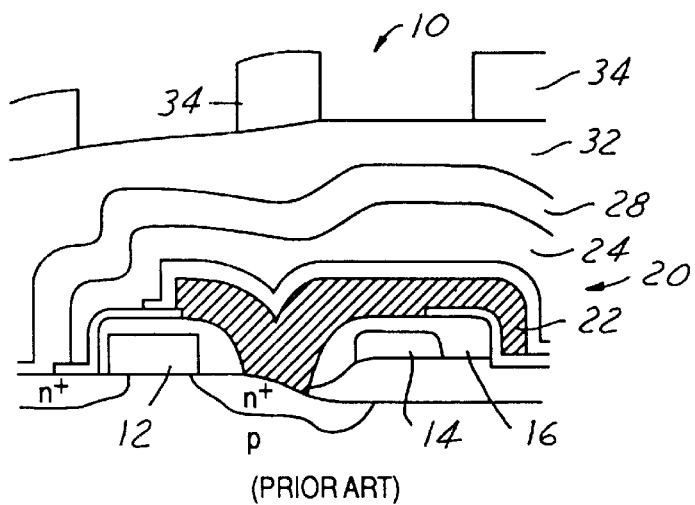
FIG. 1 is an enlarged, cross-sectional view of a conventional stacked capacitor DRAM cell.
Figure 2A:
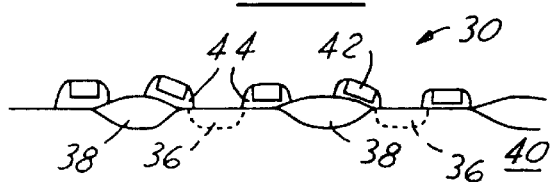
FIG. 2A is an enlarged, cross-sectional view of a present invention silicon substrate having field oxide isolations and gates built on top.

Referring initially to FIG. 2A, wherein a present invention DRAM device 30 is shown. Conventional processing methods for forming N-well and LOCOS field oxide isolations 38 are used to prepare the silicon substrate 40. Other standard processing steps for P-well formation, field implantation, APT implantation, Vt implantation for NMOS and PMOS, gate 42 formation, N-lightly doped drain 36 implantation, spacer 44 formation, and P+ and N+ implantation steps are carried out. The processing conditions used are similar to those practiced in the semiconductor industry.

Figure 2B:
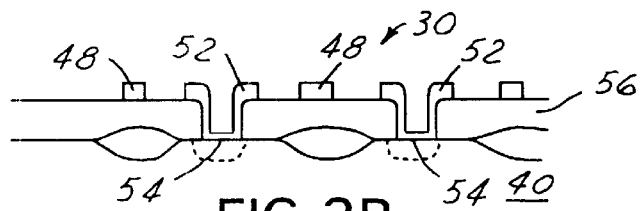
FIG. 2B is an enlarged, cross-sectional view of the present invention silicon substrate of FIG. 2A having an inter-poly-oxide layer and bit lines formed on top.

FIG. 2B is an enlarged, cross-sectional view of the present invention DRAM device shown in FIG. 2A but rotated 90° to show the formation of the bit lines 48. Buried contacts 54, (BRC-1) are also formed for contacting the silicon substrate 40. A second polysilicon layer (not shown) is used to form the bit lines 48 on a thick inter-poly-oxide layer 56 (IPO-1) which is deposited by a chemical vapor deposition technique to a thickness of approximately 3000~5000 Å. The IPO-1 56 layer is normally deposited of a BPTEOS (borophosphor TEOS) or a BPSG (borophosphor silicate glass) material by a chemical vapor deposition (CVD) process and then planarized by a reflow process. Buried contacts 54 are first formed by photomasking and etching the IPO-1 layer 56 and then polysilicon contacts 52 are deposited to contact the buried contacts 54. The bit lines 48 are formed by depositing a second polysilicon layer and then defining by a photomasking process.

Figure 2C:
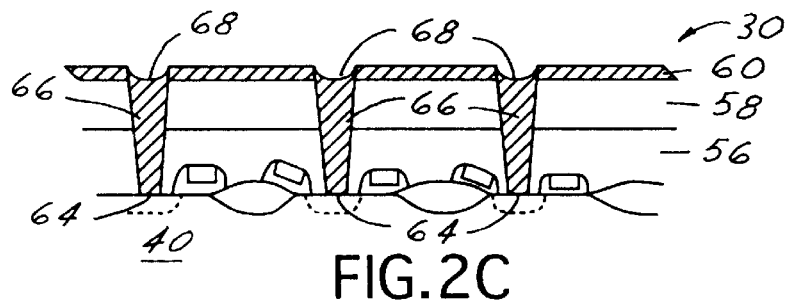
FIG. 2C is an enlarged, cross-sectional view of the present invention device of FIG. 2B having a second inter-poly-oxide layer, a silicon nitride layer and polysilicon plugs deposited on top.

FIG. 2C is an enlarged, cross-sectional view of the present invention device shown in FIG. 2B but in the word line direction. All other figures that follow also show the word line direction. A thick inter-poly-oxide layer (IPO-2) of BPTEOS is deposited on top of the IPO-1 layer 56 to a thickness of approximately 3000~5000 Å. The layer 58 is then planarized by a reflow process. A suitable reflow temperature to be used is 700–850° C. After the IPO-2 layer 58 is planarized, a thin layer of approximately 100~1500 Å of silicon nitride ($Si_3N_4$) 60 is deposited on top of the IPO-2 layer.

The silicon nitride layer 60 is then photomasked and etched by a reactive ion etching method to form second buried contacts 64. After the buried contacts 64 are formed, a thick layer of polysilicon is deposited by a chemical vapor deposition technique to fill the contact holes 66. The thickness of the third polysilicon layer is between about 2,000 and 10,000 Å such that the contact holes 66 can be adequately filled. After the complete filling of contact holes 66, the polysilicon layer is etched back by a dry etching process using the silicon nitride layer 60 as the etch-stop layer. The polysilicon plugs 68 thus formed are conveniently used as electrical connections with the silicon substrate 40 for the cylindrical capacitors to be built on top in latter processes. It should be noted that the thickness of the third polysilicon layer deposited for forming the polysilicon plugs 68 is substantially larger than the first two polysilicon layers deposited for forming the word lines and the bit lines.

Figure 2D:
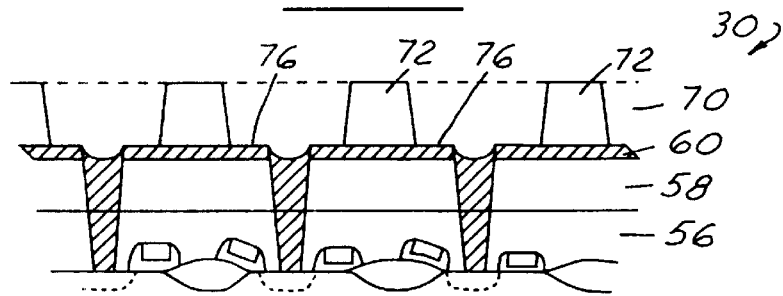
FIG. 2D is an enlarged, cross-sectional view of the present invention device of FIG. 2C having an oxide layer deposited and defined on top.

In the next processing step, as shown in FIG. 2D, a thick layer of PETEOS oxide, or BPTEOS oxide or PE-oxide 70 is deposited by a plasma enhanced chemical vapor deposition technique on top of the polysilicon plugs 68 and the silicon nitride layer 60. The thickness of the oxide layer 70 is between about 3,000 and about 10,000 Å and is substantially similar to the height of the cylindrical capacitors to be built. The oxide layer 70 is then photomasked and etched away by a dry etching method leaving oxide stumps 72 and forming third buried contacts 76 thereinbetween. The diameters of the third buried contacts 76 define the base diameters of the cylindrical capacitors to be built.

Figure 2E:
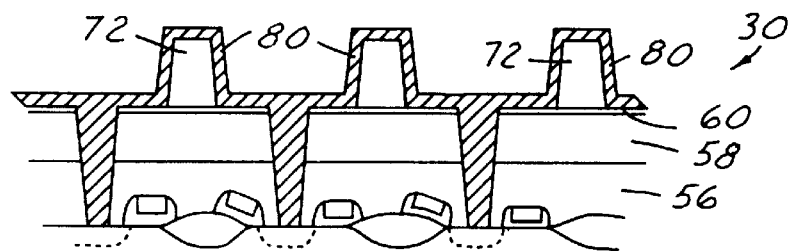
FIG. 2E is an enlarged, cross-sectional view of the present invention device of FIG. 2B having a polysilicon lower electrode formed and electrically connected to the polysilicon plugs.
Figure 2F:
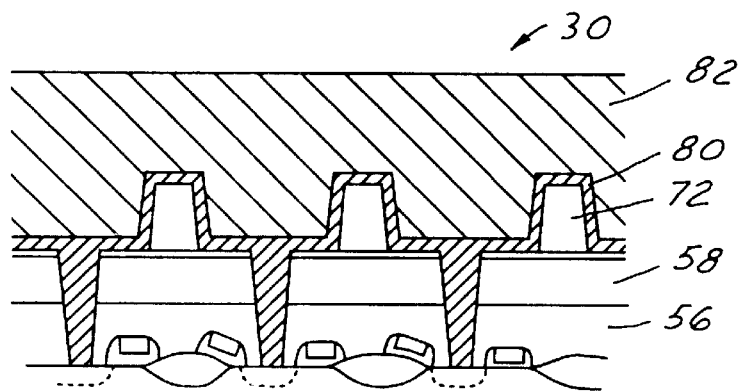
FIG. 2F is an enlarged, cross-sectional view of the present invention device of FIG. 2E having a thick oxide layer deposited on top of the polysilicon layer.

A conformal layer 80 of polysilicon is then deposited on top of the oxide stumps 72 and the silicon nitride layer 60. This is shown in FIG. 2E. The polysilicon layer 80 is in intimate and electrical contact with the polysilicon plugs 68 and will be defined to form the lower electrodes of the cylindrical capacitors. A thick layer 82 of oxide is then deposited by a PETEOS, BPTEOS, PE-oxide or SOG method over the conformal polysilicon layer. This is shown in FIG. 2F.

Figure 2G:
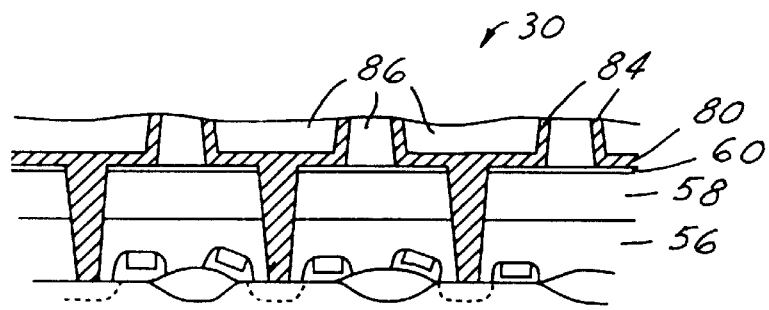
FIG. 2G is an enlarged, cross-sectional view of the present invention device of FIG. 2F having the oxide layer and the polysilicon layer partially removed by a dry etching method.
Figure 2H:
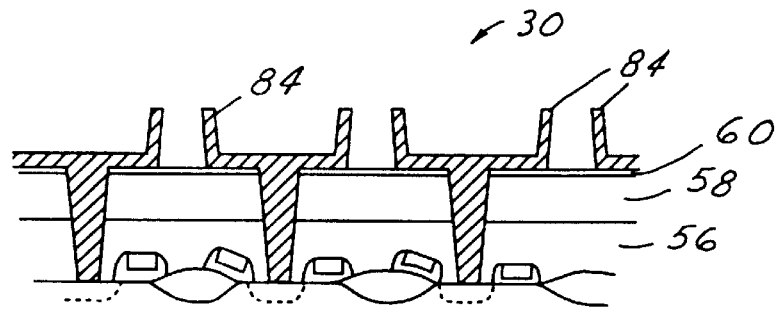
FIG. 2H is an enlarged, cross-sectional view of the present invention device of FIG. 2G having the residual oxide layer removed exposing the lower electrodes.

FIG. 2G is an enlarged, cross-sectional view of the present invention device after an upper portion of the oxide layer 82 and an upper portion of the polysilicon layer 80 are etched away by a dry etching method. The dry etch method can be conducted in a time mode wherein the etching process is stopped after a desirable height of the sidewall 84 of the polysilicon lower electrodes is reached. The residual oxide 86 is then removed by a wet etching method which stops on silicon nitride. This is shown in FIG. 2H.

Figure 2I:
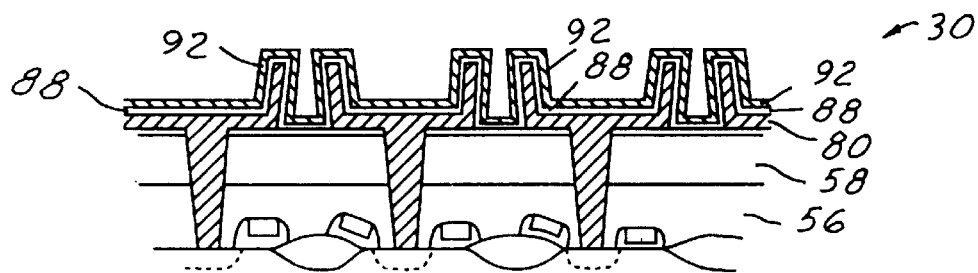
FIG. 2I is an enlarged, cross-sectional view of the present invention device shown in FIG. 2H having a thin dielectric layer and an upper electrode polysilicon layer deposited on top.

After a desirable height of the lower electrodes 84 is achieved in the previous process, a thin layer of a dielectric material 88 and a polysilicon layer 92 for the cell plate (or the upper electrodes) are sequentially deposited on top of the present invention device 30. The dielectric material layer 88 can be suitably an oxide-nitride-oxide (ONO) composite film. This is shown in FIG. 2I. The individual cylindrical capacitor of the present invention can then be defined such that each transistor is coupled with a storage capacitor of the cylindrical configuration to form the DRAM cell.

Figure 3A:
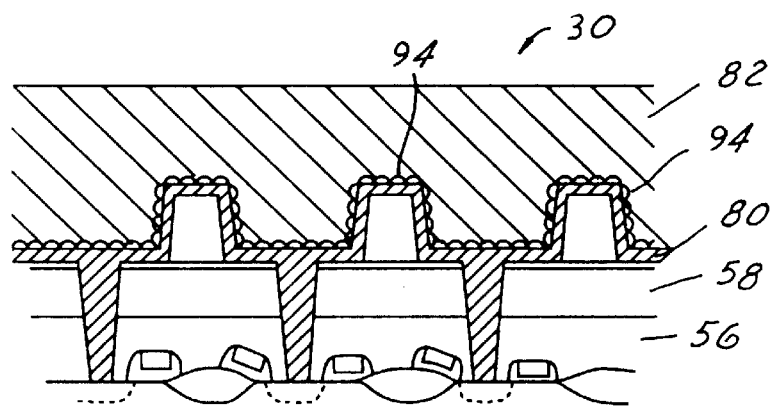
FIG. 3A is an enlarged, cross-sectional view of an alternate embodiment of the present invention device shown in FIG. 2F having a rugged polysilicon layer deposited on top.
Figure 3B:
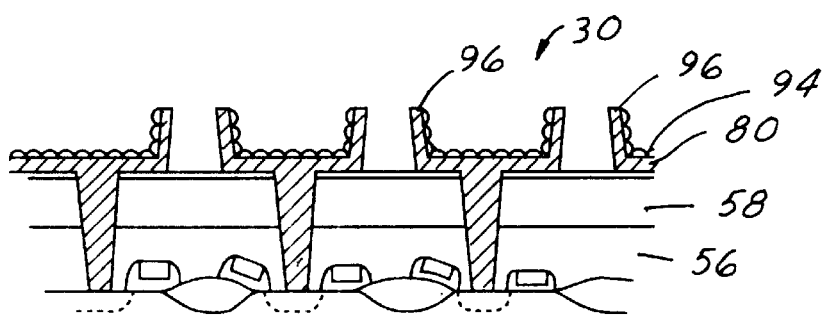
FIG. 3B is an enlarged, cross-sectional view of the alternate embodiment of FIG. 3A having the upper electrodes for the capacitors formed.
Figure 3C:
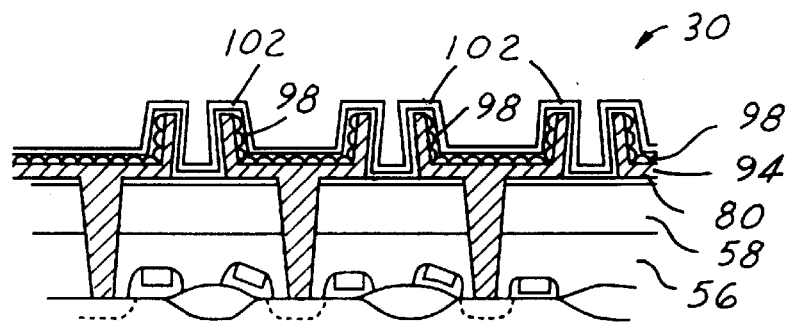
FIG. 3C is an enlarged, cross-sectional view of the alternate embodiment of FIG. 3B having a dielectric layer and an upper electrode polysilicon layer deposited on top.

In an alternative embodiment, after the polysilicon layer 80 is deposited on the present invention device 30, as shown in FIG. 2E, a layer of rugged polysilicon 94 is first deposited prior to the deposition of the oxide layer 82. The rugged polysilicon layer 94 presents a top surface in a hemispherical configuration, can be deposited at a lower deposition temperature than that normally used for polysilicon deposition. The rugged polysilicon layer 94 provides enhanced surface areas such that the capacitance of the capacitor later built can be improved. The rugged polysilicon coated lower electrodes 96 can then be processed by the same procedures as shown in FIGS. 3B and 3C. The lower electrodes 96 are first formed, as shown in FIG. 3B, and then a dielectric layer 98 and a polysilicon layer 102 for the upper electrodes are sequentially deposited and formed to complete the cylindrical capacitor fabrication process.

The present invention novel process for making a stacked capacitor DRAM cell has thus been amply demonstrated by a preferred embodiment and an alternate embodiment. The present invention method for forming stacked capacitor is compatible with the more recently developed chemical mechanical polishing process for planarizing a semiconductor device. Because of the smaller real estate needed for building such a DRAM cell, the present invention method can be advantageously applied to devices in the 0.18 micron scale or less.

While the present invention has been described in an illustrative manner, it should be understood that the terminology used is intended to be in a nature of words of description rather than of limitation.

Furthermore, while the present invention has been described in terms of a preferred and an alternate embodiments, it is to be appreciated that those skilled in the art will readily apply these teachings to other possible variations of the inventions.

The embodiment of the invention in which an exclusive property or privilege is claimed are defined as follows:

What is claimed is:

1. A method for making a stacked capacitor dynamic random access memory (DRAM) cell comprising the steps of:

forming a first dielectric layer on a pre-processed wafer, forming contact windows to expose said wafer surface, depositing a first conductive layer and forming conductive plugs, depositing a second dielectric layer on top of said conductive plug, forming contact windows in said second dielectric layer exposing said conductive plugs, depositing a second conductive layer on said second dielectric layer and forming a lower electrode for said capacitor, depositing a third dielectric layer on top of said second conductive layer, planarizing said third dielectric layer and said second conductive layer by removing top portions of said layers, removing a remaining portion of said third dielectric layer, depositing a fourth dielectric layer of a thickness smaller than said third dielectric layer, on top of said second conductive layer after said second conductive layer being formed into a lower electrode, and depositing a third conductive layer on top of said fourth dielectric layer forming upper electrodes for said cylindrical capacitors.

2. A method according to claim 1 further comprising the step of depositing a layer of silicon nitride on top of said first dielectric layer.

3. A method according to claim 1, wherein said second dielectric layer is deposited to a thickness similar to a height of the capacitor to be built.

4. A method according to claim 1, wherein said first dielectric layer is formed by at least two inter-poly-oxide layers having polysilicon bit lines formed thereinbetween.

5. A method according to claim 1 further comprising back-end processes of oxide planarization, metal deposition, via formation and passivation after the formation of said upper electrodes.

6. A method according to claim 1, wherein said first, second and third dielectric layers are deposited of an oxide material from a BPTEOS or BPSG process.

7. A method according to claim 3 further comprising the step of planarizing said second dielectric layer by a reflow process or a chemical mechanical polishing process.

8. A method according to claim 3, wherein said first and second dielectric layers are deposited by a chemical vapor deposition method.

9. A method according to claim 1 further comprising the steps of:

forming a silicon nitride etch-stop layer on said second dielectric layer, and forming the conductive plugs by etching-back said first conductive layer and stopping at said silicon nitride etch-stop layer.

10. A method according to claim 1, wherein said conductive plugs are polysilicon plugs.

11. A method for making a stacked capacitor dynamic random access memory (DRAM) cell comprising the steps of forming a first dielectric layer on a pre-processed wafer, planarizing said first dielectric layer, depositing a nitride layer on top of said first dielectric layer, forming contact windows to expose said wafer surface, depositing a first conductive layer and forming conductive plugs, depositing a second dielectric layer on top of said conductive plug and said nitride layer, planarizing said second dielectric layer, forming contact windows in said second dielectric layer exposing said conductive plugs, depositing a second conductive layer on said second dielectric layer and forming a lower electrode for said capacitor, depositing a third dielectric layer on top of said second conductive layer, planarizing said third dielectric layer and said second conductive layer, etching away said remaining third dielectric layer, depositing a fourth dielectric layer of a thickness smaller than said third dielectric layer, and depositing a third conductive layer on top of said fourth dielectric layer forming an upper electrode of a cylindrical capacitor of said DRAM cell.

12. A method according to claim 11 further comprising the step of depositing a rugged polysilicon layer on top of said second conductive layer prior to the deposition of said fourth dielectric layer.

13. A method according to claim 11 further comprising the step of planarizing said first, second and third dielectric layers by a reflow process or a chemical mechanical polishing process.

14. A method according to claim 11 further comprising the step of forming buried contacts for said conductive plugs and making electrical contacts with said wafer.

15. A method according to claim 11, wherein said first, second and third conductive layers are deposited of polysilicon.

16. A method according to claim 11, wherein said first, second and third dielectric layers are formed by depositing silicon oxide.

17. A method according to claim 11, wherein said fourth dielectric layer is formed by depositing an oxide-nitride-oxide.

18. A method according to claim 11, wherein said nitride layer is silicon nitride or silicon oxynitride.

* * * * *